United States Patent [19]

Amazawa et al.

[11] Patent Number: 4,862,097
[45] Date of Patent: Aug. 29, 1989

[54] PULSATING NOISE REMOVAL DEVICE

[75] Inventors: Kiyoshi Amazawa; Akira Mori, both of Tokyo, Japan

[73] Assignee: Clarion, Co., Ltd., Tokyo, Japan

[21] Appl. No.: 145,220

[22] Filed: Jan. 19, 1988

[30] Foreign Application Priority Data

Jan. 23, 1987 [JP] Japan .................. 62-013878

[51] Int. Cl.$^4$ .......... H03K 5/00; H03K 3/06; H04B 1/10
[52] U.S. Cl. ................ 328/165; 328/167; 328/192; 328/162; 307/542; 307/520; 330/109
[58] Field of Search ........... 328/165, 167, 191, 192, 328/193, 207; 367/901; 307/542, 520, 521; 328/161, 162, 163; 330/107, 109; 455/296

[56] References Cited

U.S. PATENT DOCUMENTS

| 4,216,430 | 8/1980 | Amazawa et al. | 455/219 |
| 4,256,975 | 3/1981 | Fukushima et al. | 328/165 X |
| 4,612,662 | 9/1986 | Kuwajima et al. | 381/10 |
| 4,701,715 | 10/1987 | Amazawa et al. | 328/165 |

FOREIGN PATENT DOCUMENTS

| 0034553 | 3/1980 | Japan | 355/296 |
| 0074248 | 6/1980 | Japan | 455/296 |
| 0091732 | 5/1984 | Japan | 455/296 |
| 0041230 | 2/1986 | Japan | |

Primary Examiner—Stanley D. Miller
Assistant Examiner—Huy Kim Mai
Attorney, Agent, or Firm—Flynn, Thiel, Boutell & Tanis

[57] ABSTRACT

A pulsating noise removal device detects a pulsating noise, controls a gate circuit for selectively permitting an audio signal to pass through in response to the detection, and removes pulsating noises from the audio signal. The device particularly includes filter circuits for extracting pulsating noises and signal components from the audio signal, respectively, and includes automatic gain control circuits responsive to respective output signals of the filter circuits to respectively control the gain of an amplifier circuit for detecting pulsating noises.

7 Claims, 5 Drawing Sheets

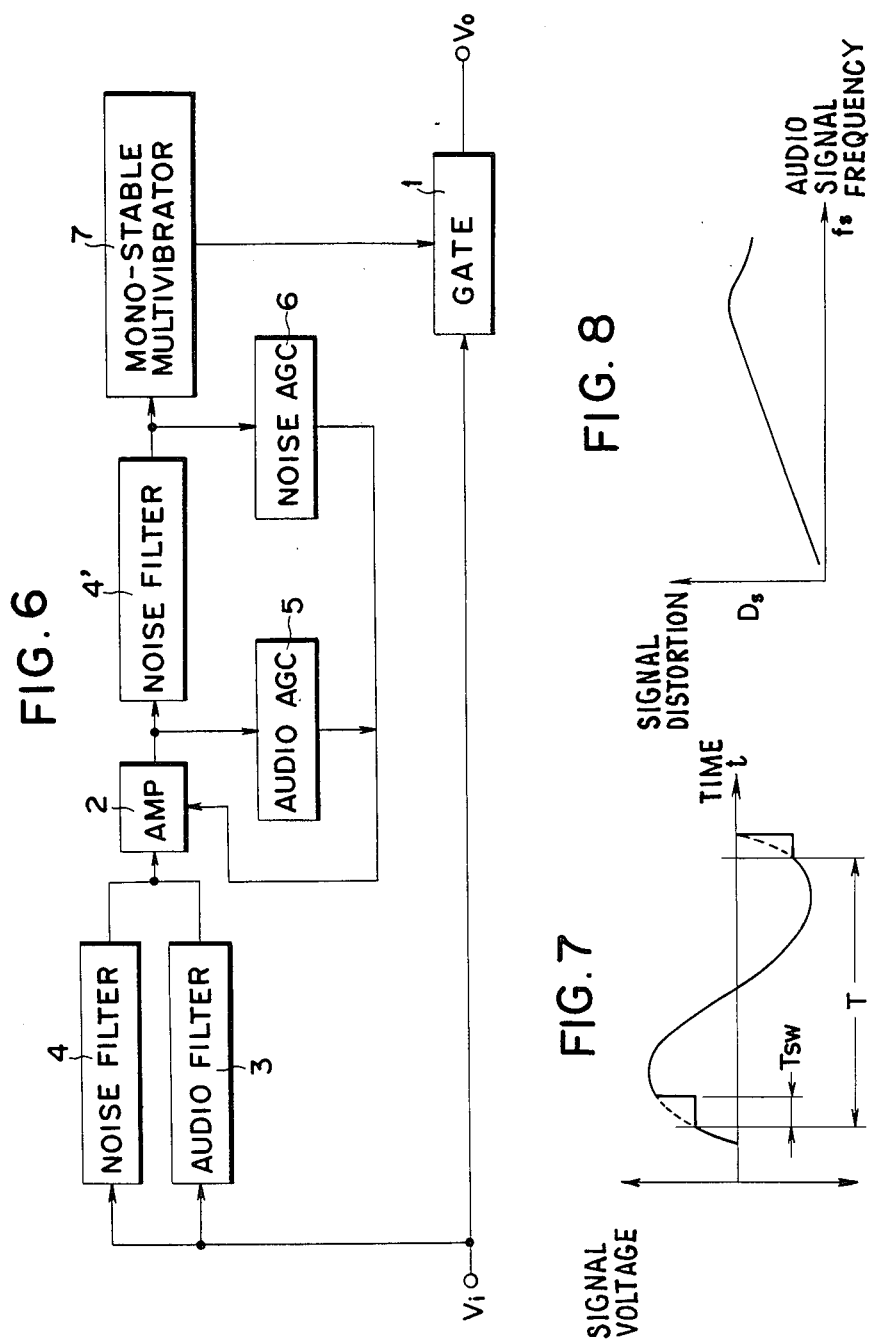

PULSATING NOISE REMOVAL DEVICE

FIELD OF THE INVENTION

This invention relates to a pulsating noise removal device, and more particularly to a pulsating noise removal device suitable for removing noises by switching a gate circuit according to a pulsating noise.

BACKGROUND OF THE INVENTION

In a car driven by a gasoline engine or other internal combustion engine requiring an ignition plug, pulsating ignition noises are produced, and a car radio, etc. on board catches such ignition noises and reproduces a sound difficult to hear. In this connection, most car radios have a filter inserted in a power source circuit and include a noise removal device.

FIG. 10 is a block diagram of a prior art pulsating noise removal device.

In a normal conduction without noises, a gate circuit 1 outputs an entered audio signal Vi in the original form as an output signal Vo. A circuit for controlling the gate circuit 1 consists of a high-pass filter (HPF) 11, amplifier (AMP) 12, AGC circuit 13 and monostable multivibrator circuit 14. The HPF 11 removes an audio signal S from the entered signal Vi (audio signal S+pulsating noise N) and permits a pulsating noise N alone to pass through. An output signal of the HPF 11 is amplified by the AMP 12 and subsequently applied to the AGC circuit 13 and the monostable multivibrator circuit 14. The AGC circuit 3 is used to prevent that the gate circuit 1 is continuously blocked and that the output signal Vo is continuously withheld when noise components are continuously detected.

The monostable multivibrator circuit 14 is configured to generate a predetermined constant switching pulse when a pulsating noise is detected, so that the pulse blocks the gate circuit 1 in order to not output the entered signal Vi so as to remove the pulsating noise N. As the gate circuit 1, a pre-holding type or a linear or other signal compensation type is used in most cases.

FIG. 7 shows a waveform of a signal from which a noise has been removed by a pre-holding type gate circuit. Tsw indicates a switching time in which the gate 1 is turned off in order to remove a pulsating noise, and it has a length corresponding to the pulsating noise. T designates a repeat cycle of the puslating noise which actually exhibits various values depending on noise sources.

FIG. 8 shows the signal distortion ratio characteristic against an audio signal frequency upon a noise removal switching of an audio signal. As the signal frequency fs increases, the distortion ratio Ds increases. Also when a linear compensation type is used as the gate circuit 1, the same tendency is seen.

Systems of this type are disclosed in Japanese Patent Publications No. 55-46087 and No. 56-45535.

In the prior art pulsating noise removal devices, however, when the audio signal cycle decreases with respect to the switching time, the gate switching causes an increase in the distortion and causes an inversion phenomenum which gives a user an impression that the noise rather increases.

The inversion phenomenum occurs because the signal takes the form of P1-P2-P3 in the switching time Tsw in which the gate 1 is turned off and loses a portion corresponding to an area As with respect to the original signal. When no signal is removed, a pulsating noise An having an area hatched in the drawing is added to the signal S. The lost signal portion As and the pulsating noise component An both invite a distortion of the original signal.

If the pulsating noise component An is sufficiently large as compared to the lost signal portion As (when a pulsating noise is large), the signal distortion can be decreased by effecting a switching to turn off the gate 1 to remove the noise. Most pulsating noise removal devices aim this effect.

In contrast, if the pulsating noise component An is small with respect to the lost signal portion As (when a pulsating noise is small), a switching action to turn off the gate 1 rather increases the distortion. That is, an inversion phenomenum occurs. Therefore, the noise removal device must be held inoperative in this case. However, the lost area As of the signal caused by a switching varies with the signal frequency. That is, it decreases or increases when the signal frequency is low or high. Therefore, assuming that the pulsating noise magnitude is constant, the noise removal device must effect its removal operation at a low signal frequency but stop its operation at a high frequency causing an inversion phenomenum. However, prior art noise removal devices are not configured in this fashion, and are subject to an inversion phenomenum.

OBJECT OF THE INVENTION

It is therefore an object of the invention to provide a pulsating noise removal device capable of reducing an inversion phenomenum upon a switching operation to turn off a gate circuit.

SUMMARY OF THE INVENTION

The above-indicated object is attained by the use of a control means for controlling the noise detection sensitivity in response to the level and the frequency of an audio signal passing through the gate circuit.

The device operates so as to remove noises below a frequency causing an inversion phenomenum but not remove noises above the frequency. In this fashion, the signal distortion exhibits a value proportional to a frequency below the frequency and exhibits a constant value above the frequency. Therefore, the inventive device never causes an inversion phenomenum below the frequency.

BRIEF DESCRIPTION OF THE DRAWINGS

FIG. 6 is a block diagram showing a modification of FIG. 1;

FIG. 7 is an explanatory view of noise removal by a prior art noise removal device;

FIG. 8 is a characteristic view of a signal distortion Ds with respect to an audio signal frequency fs;

DETAILED DESCRIPTION

A pulsating noise removal device according to the invention is explained below in detail.

Figures 1, 2:
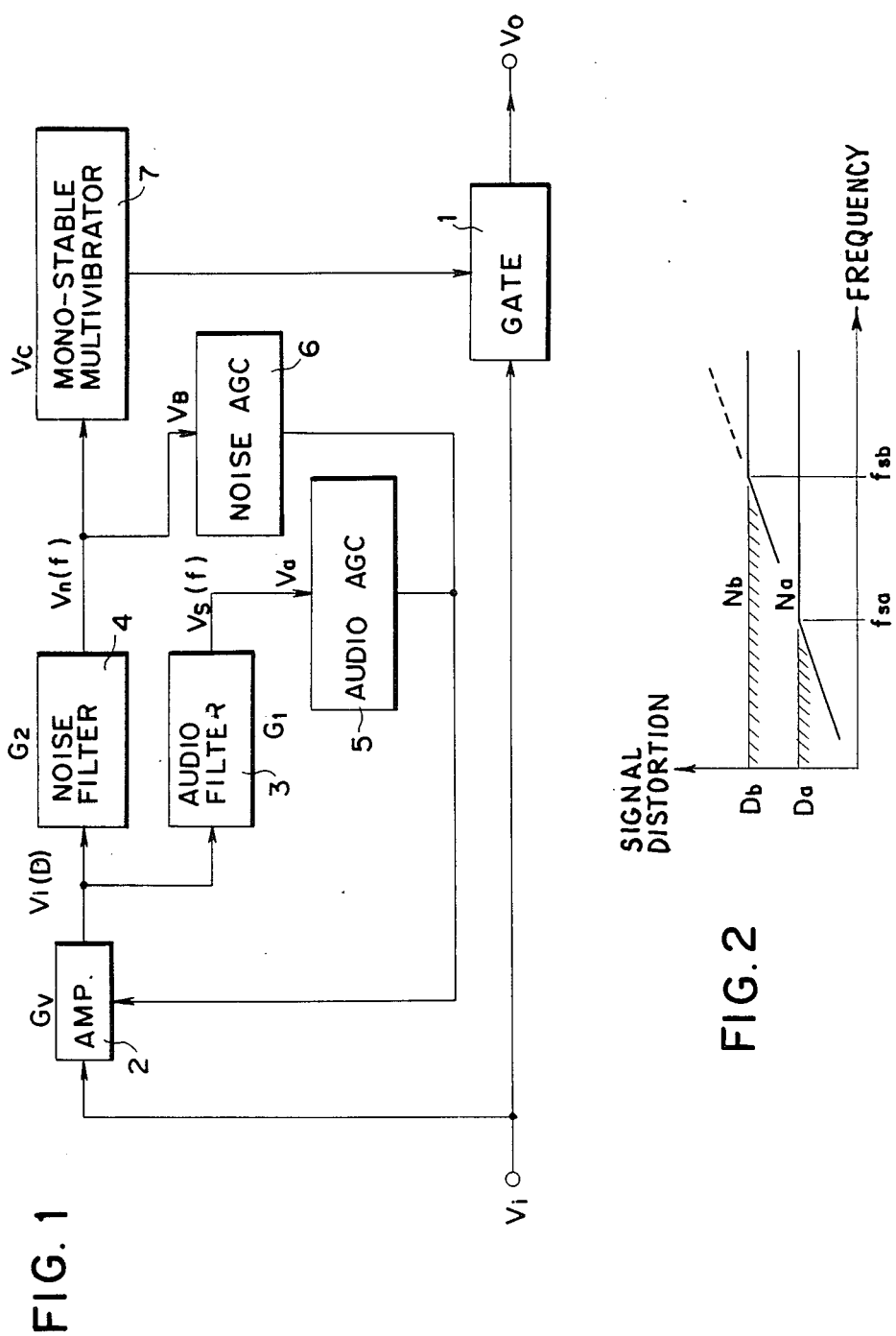
FIG. 1 is a block diagram showing an embodiment of the invention.
FIG. 2 is an explanatory view of an inversion phenomenum improvement according to the inention.

FIG. 1 is a block diagram of an embodiment of the invention.

An audio filter 3 and a noise filter 4 are connected to an amplifier (AMP) 2 for amplification of an entered signal Vi. To respective filters 3 and 4 are connected an audio AGC circuit 5 and a noise AGC circuit 6. Outputs of both AGC circuits 5 and 6 are entered in an AGC control terminal of the amplifier 2. A monostable multivibrator circuit 7 is inserted between the noise filter 4 and a gate 1.

Before explaining how to operate the device of FIG. 1, basic principles of the invention are explained below, referring to FIGS. 2 and 3.

As shown in FIG. 2, when a noise Na of a level causing a signal distortion Da is entered, the invention effects or not effects its noise removal operation, taking an audio signal frequency fsa causing an inversion phenomenun as a borderline. More specifically, noise removal is effected at frequencies below fsa, and is stopped at frequencies above fsa. As a result, the signal distortion is maintained at a substantially constant value against frequencies above fsa, and is decreased below Da against frequencies below fsa. Therefore, no inversion phenomenun occurs.

When the noise level increases from Na to Nb, the frequency causing an inversion phenomenun is changed from fsa to fsb, and the frequency fsb is used as the borderline for noise removal operations. In this fashion, although the maximum signal distortion increases from Da to Db, the device can reiliably hold the distortion below Db.

Human ears can distinguish noises having indentical levels if an audio level is small with respect to a noise level. However, when the audio signal level increases, noises cannot be distinguished by human ears. That is, a masking effect occurs.

The prior art pulsating noise removal device, however, removes noises regardless of audio signal levels. Therefore, when an audio signal is small, i.e. when no signal exists, for example, a pulsating noise is heard unconfortably. In contrast, the invention not only prevents an inversion phenomenun caused by a change in the audio signal frequency as described above, but also compares the pulsating noise with the audio signal level to also prevent an inversion phenomenun caused by a change in the audio signal level.

Figure 3:
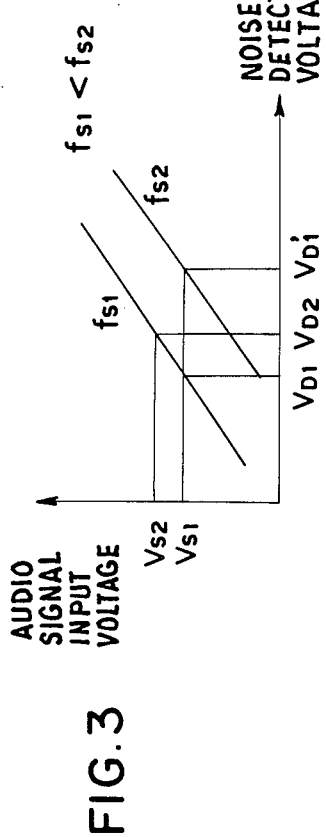
FIG. 3 is a characteristic view of an entered audio signal level with respect to a noise detection level.

FIG. 3 explains an operation in this respect. When the frequency of an entered signal $V_{S1}$ of the gate circuit 1 is $f_{S1}$, $V_{D1}$ is used as the pulsating noise detection level in order to not effect a switching to turn off the gate circuit 1 against a small pulsating noise causing an inversion phenomenun. When the audio signal input level increases from $V_{S1}$ to $V_{S2}$, the noise detection level is increased from $V_{D1}$ to $V_{D2}$ in order to withhold noise removal against a pulsating noise slightly larger than $V_{S1}$.

When the audio signal frequency increases from $f_{S1}$ to $f_{S2}$, the detection level is increased from $V_{D1}$ to $V_{D1}'$ so as to not detect small noises. In this fashion, the device can prevent an inversion phenomenun against changes in either the signal frequency or the signal amplitude.

Now referring to the embodiment of FIG. 1 which realizes the above-described principles, its operation is explained below. In this embodiment, in lieu of changing the noise detection level $V_{D1}$ in FIG. 3, the gain of the amplifier 2 preceding the noise filter 4 is controlled by the AGC.

The amplifier 2 amplifies the input signal Vi and supplies Vi(D). The Vi(D) is expressed by:

$$Vi(D) = Vs + Vn \quad (1)$$

where

Vs: audio signal component; and
Vn: pulsating noise component.

In this case, a noise is detected regarding Vn which satisfies the following expression, and a noise removal operation is effected.

$$K < Vn/Vs \quad (2)$$

where $$K = Vn(K)/Vs(K) \quad (3)$$

(K: ratio of audio signal component Vs(K) and pulsating noise component Vs(K) at the beginning of an inversion phenomenun).

A control is effected using an AGC loop so that the value of K increases as the audio frequency fs increases. The audio filter 3 is used to vary K with the audio signal frequency fs, and produces Vs(f). Further, the noise filter 4 excludes the audio signal component Vs while permitting the noise component Vn to pass through, and produces Vn(f).

The audio AGC circuit 5 is activated when the output signal Vs(f) of the audio filter 3 reaches the level of Va, and the noise AGC circuit 6 is activated when the output Vn(f) of the noise filter 4 reaches $V_B$ so that the gate circuit 1 is not continuously blocked (the gate output Vo is not stopped) when the pulsating noise cycle significantly decreases.

The monostable multivibrator circuit 7 is configured to produce a predetermined switching pulse when the output Vn(f) of the noise filter 4 reaches Vc, in order to turn off the gate circuit 1. Noises are removed under a control of the pulse.

An audio AGC operation is explained below.

Designating the voltage gain of the audio filter 3 by $G_1$ and the voltage gain of the noise filter 4 by $G_2$, and designating by Vs(f') the audio signal level at the output of the audio filter 3 in absence of an AGC system, the following relationship is established:

$$Vs(f') = Vs \cdot G_1$$

Further, designating the noise level at the output of the noise filter 4 at this time by Vn(f'), the following relationship is established:

$$Vn(f') = Vn \cdot G_2$$

Designating by Vs(f) the output of the audio filter 3 when the AGC system is activated, Vs(f) = Va must be satisfied, and the following expression is obtained:

$$Vs(f) = K_1 \cdot Vs(f')$$

($K_1$: suppression coefficient by audio AGC) = Va $$\therefore K_1 = Va/Vs \cdot G_1 \quad (4)$$

Designating by Vn(f) the noise level at the output of the noise filter 4 under audio AGC, the following relationship is established:

$$Vn(f) = K_1 \cdot Vn(f') \quad (5)$$
$$= \frac{Vn}{Vs} \cdot \frac{G_2}{G_1} \cdot Va$$

assuming $Vc/Va = K_2$,
the following relationship is established:

$$Vn(f) = Vn/Vs \cdot G_2/G_1 \cdot Vc/K_2 \quad (6)$$

Here, if $Vn(f) = Vc$, an inversion phenomenum is not prevented unless the following conditions are satisfied:
$Vs = Vs(K)$ $Vs(K)$: signal component of AMP output at the beginning of an inversion phenomenon;
$Vn = Vn(K)$ $Vn(K)$: pulse noise component of AMP output at the beginning of an inversion phenomenon.

Therefore, from equations (3) and (6), the following equation is obtained:

$$K = G_1/G_2 \cdot K_2 \quad (7)$$

In equation (7), by fixing $K_2$ and $G_2$ and varying $G_1$ with frequency, the value of K can be moved.

As referred to FIG. 3, an inversion is not prevented unless K is increased with an increase in the audio signal frequency and unless the noise detection sensitivity is decreased.

Therefore, by using a high-pass filter as the audio filter 3, the operation can be accomplished.

Further, the noise filter 4 used to exclude audio signal components may be a high-pass filter having a blocking frequency near the upper limit of the audio signal frequency band.

The relationship between the audio frequency and an inversion phenomenum varies with the signal compensation method of the gate circuit 1 or with the band of an audio signal entered in the gate circuit 1. However, they are matched by changing the characteristic of the audio filter 3.

In order to prevent an inversion phenomenum by the audio AGC 5, it is necessary that the noise AGC 6 is activated only when the pulsating noise cycle is so short to continuously turn off the gate circuit 1, and is not activated otherwise. This configuration is readily established by satisfying $V_B < V_C$ or $V_B \approx V_C$, and using a time constant in the noise AGC 6 for d.c. smoothing.

The aforegoing embodiment has been explained under an assumption that the output Vs(f) of the audio filter 3 includes the audio signal component Vs but not the noise component Vn. Actually, however, it also includes the noise component Vn. As far as the pulsating noise does not extremely increase with respect to the audio signal, it is immaterial in practical use. However, in order to completely prevent any problem in this respect, an arrangement of FIG. 4 may be employed.

Figure 4:
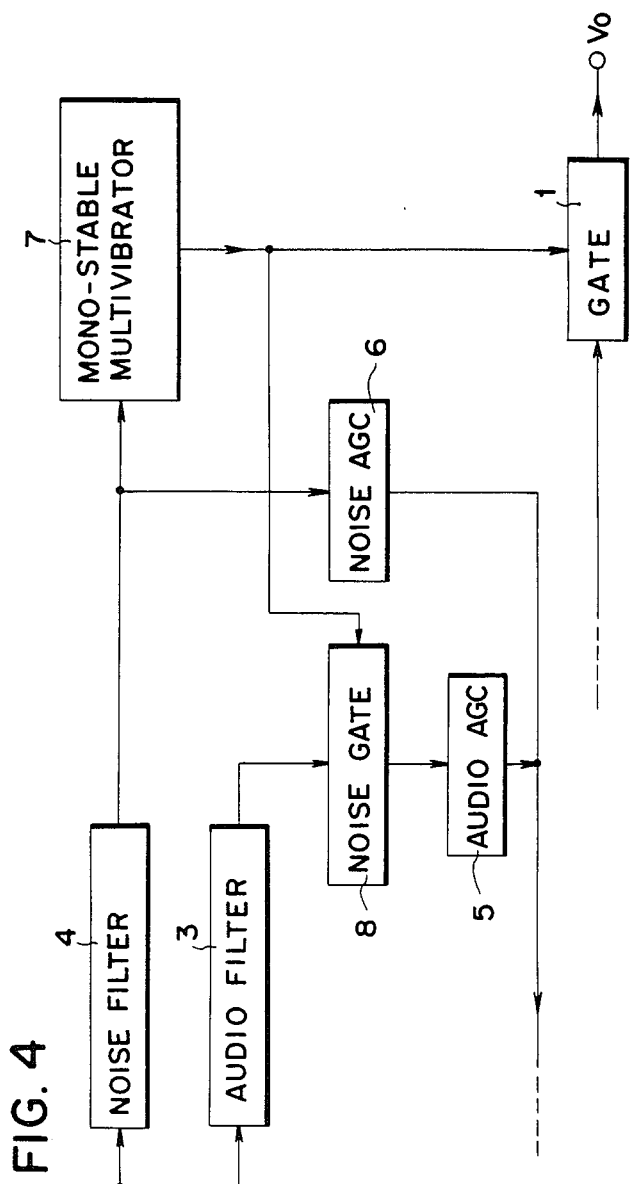
FIG. 4 is a fragmentary block diagram showing a further embodiment of the invention.

In FIG. 4, a noise gate circuit 8 is interposed between the audio filter 3 and the audio AGC circuit 5 so that such a problem is prevented by controlling the noise gate circuit 8 by an output of the monostable multivibrator circuit 7. More specifically, the noise gate circuit 8 is turned off when the monostable multivibrator circuit 7 produces a switching pulse, and prevents that the noise component is supplied to the audio AGC circuit 5.

Figure 5:
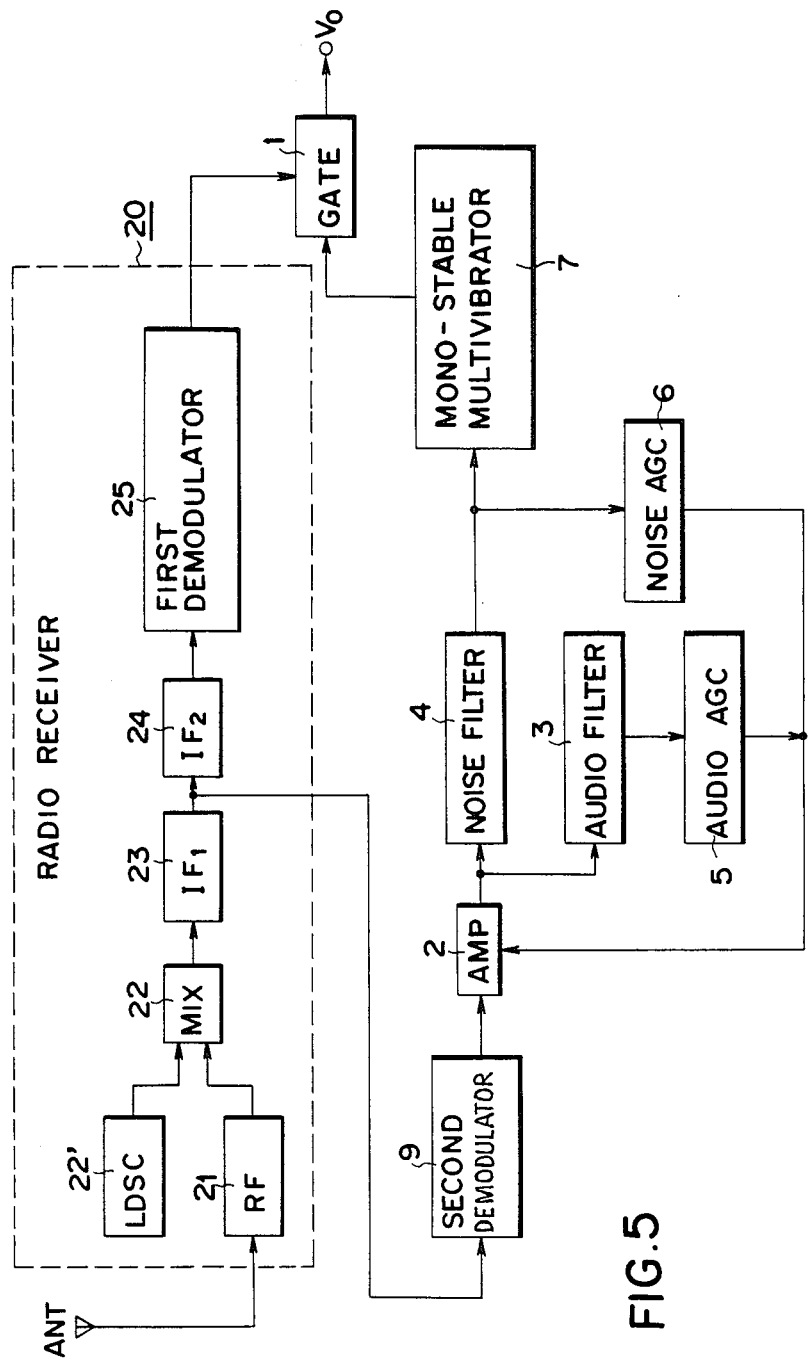
FIG. 5 is a block diagram showing a modification of the invention.
Figure 9:
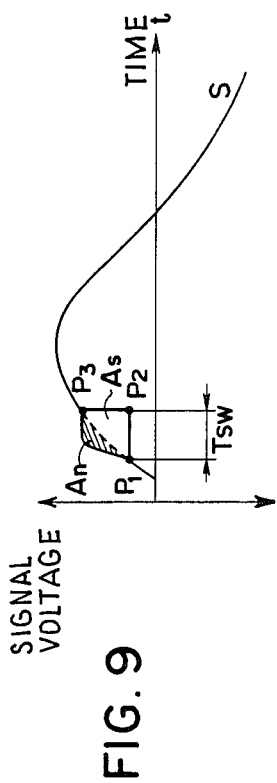
FIG. 9 is an explanatory view for explaining how an inversion phenomenum occurs in an audio signal upon a switching of a gate circuit.
Figure 10:
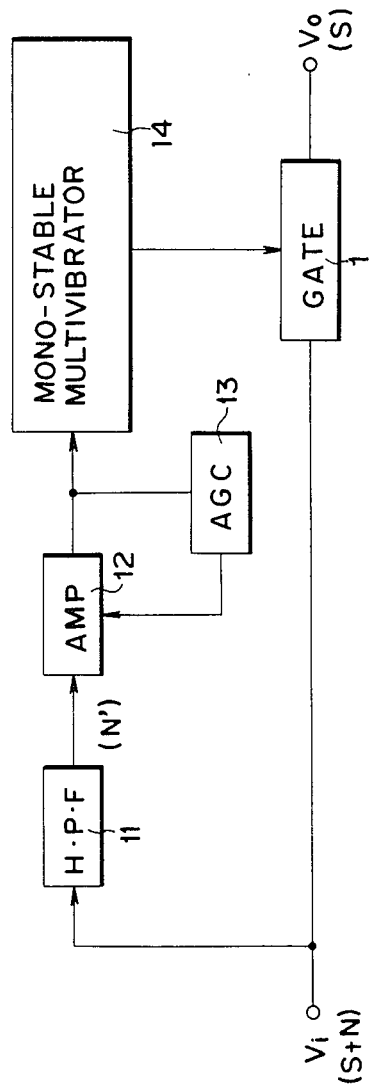
FIG. 10 is a block diagram of a prior art pulsating noise removal device.

When the noise detection input and the input of the gate circuit 1 are in different circuit systems as shown in FIG. 5, the audio signal frequency characteristics are different between the systems. In this case, a correspondence is established by changing the frequency characteristic of the audio filter. In the drawing, reference numeral 20 refers to a radio receiver circuit which consists of a high frequency amplifier (RF) 21 for amplifying a signal from an antenna (ANT), a mixer (MIX) 22, a local oscillator circuit 22', intermediate frequency amplifiers (IF$_1$, IF$_2$) 23 and 24, and a first demodulator 25 for demodulating their outputs and for outputting audio signals. An output of the first demodulator 25 is entered in the gate circuit 1. A signal for the amplifier 2 is given thereto by demodulating an output of the intermediate frequency amplifier 23 by a second demodulator 9.

FIG. 6 shows a modification of FIG. 1 in which an additional noise filter 4' is used.

As described above, the invention can prevent inversion phenomena against changes not only in the voltage level but also in the frequency of an audio signal. Further, the invention can alleviate erroneous detection of pulsaing noises caused by high frequency distortions of an audio signal, by properly selecting the frequency characteristic of the audio filter.

What is claimed is:

1. A pulsating noise removal device, comprising:
    a noise removal gate circuit provided in a major signal path for a first audio signal which includes a signal component and a pulsating noise component, said gate circuit having an output and having an input to which is applied said first audio signal;
    a variable gain amplifier having an output and having an input to which is applied a second audio signal which includes said signal component and said pulsating noise component;
    noise component detecting means responsive to said output of said amplifier for detecting said pulsating noise component in said second audio signal;
    signal component detecting means responsive to said output of said amplifier for detecting said signal component in said second audio signal;
    noise automatic gain control means responsive to detection of said noise component by said noise component detecting means for varying the gain of said amplifier;
    audio automatic gain control means responsive to said signal component detected by said signal component detecting means for varying the gain of said amplifier; and
    gate control signal generating means responsive to detection of said noise component by said noise component detecting means for generating a control signal for turning on or off said gate circuit.

2. A pulsating noise removal device according to claim 1, wherein said noise component detecting means includes a noise filter interposed between said amplifier and said noise automatic gain control means, and wherein said signal component detecting means includes an audio filter interposed between said amplifier and said audio automatic gain control means.

3. A pulsating noise removal device acccording to claim 2, further comprising a noise gate interposed between said audio filter and said audio automatic gain control means and turned on or off by said control signal from said gate control signal generating means.

4. A pulsating noise removal device according to claim 1, wherein said input of said noise removal gate circuit is connected to an output of a first demodulator circuit of a radio receiver, and wherein said input of said amplifier is connected to an intermediate frequency amplifier circuit of the radio receiver through a second demodulator circuit.

5. A pulsating noise removal device according to claim 1, wherein said input of said gate circuit and said input of said amplifier are connected together, said first and second audio signals being identical.

6. A pulating noise removal device, comprising:
a noise removal gate circuit provided in a major signal path for an audio signal which includes a signal component and a puslating noise component, said gate circuit having an output and having an input to which is applied said audio signal;
first noise component detecting means for detecting said pulsating noise component in said audio signal;
signal component detecting means for detecting said signal component in said audio signal;
a variable gain amplifier having an output and having an input coupled to said first noise component detecting means and to said signal component detecting means, said amplifier amplifying a composite signal which includes said signal component detected by said signal component detecting means and said pulsating noise component detected by said first noise component detecting means;
audio automatic gain control means coupled to said output of said amplifier and responsive to said signal component of said composite signal for varying the gain of said amplifier;
second noise component detecting means for detecting said noise component at said output of said amplifier;
noise automatic gain control means responsive to said noise component detected by said second noise component detecting means for varying the gain of said amplifier; and
gate control signal generating means responsive to detection of said noise component by said second noise component detecting means for generating a control signal for turning on or off said gate circuit.

7. A pulsating noise removal device according to claim 6, wherein said second noise component detecting means includes a first noise filter having an input connected to said output of said amplifier and having an output coupled to said noise automatic gain control means, wherein said first noise component detecting means includes a second noise filter having an input connected to said input of said gate circuit and having an output connected to said input of said amplifier, and wherein said signal component detecting means includes an audio filter having an input connected to said input of said gate circuit and having an output connected to said input of said amplifier.

* * * * *